United States Patent
Allen et al.

(10) Patent No.: US 7,669,159 B2
(45) Date of Patent: Feb. 23, 2010

(54) IC TILING PATTERN METHOD, IC SO FORMED AND ANALYSIS METHOD

(75) Inventors: Robert J. Allen, Jericho, VT (US); John M. Cohn, Richmond, VT (US); Peter A. Habitz, Hinesburg, VT (US); William Leipold, Enosburg Falls, VT (US); Ivan Wemple, Shelburne, VT (US); Paul S. Zuchowski, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 579 days.

(21) Appl. No.: 11/160,339

(22) Filed: Jun. 20, 2005

(65) Prior Publication Data

US 2005/0273744 A1    Dec. 8, 2005

Related U.S. Application Data

(63) Continuation of application No. PCT/US02/41188, filed on Dec. 20, 2002.

(51) Int. Cl.
G06F 17/50 (2006.01)
(52) U.S. Cl. .............................. 716/8; 716/1
(58) Field of Classification Search .......... 716/1–5; 257/776
See application file for complete search history.

(56) References Cited

U.S. PATENT DOCUMENTS

| 4,254,445 | A |   | 3/1981  | Ho |
| 5,500,376 | A | * | 3/1996  | Ishaque et al. ............... 438/73 |
| RE36,145  | E |   | 3/1999  | DeAguiar et al. |
| 5,889,329 | A |   | 3/1999  | Rostoker et al. |
| 5,991,224 | A |   | 11/1999 | Aipperspach et al. |
| 6,184,057 | B1 | * | 2/2001  | Van Andel et al. ............ 438/66 |
| 6,262,487 | B1 | * | 7/2001  | Igarashi et al. .............. 257/758 |
| 6,690,025 | B2 | * | 2/2004  | Won et al. ...................... 257/3 |
| 6,948,146 | B2 | * | 9/2005  | Allen et al. ................... 716/13 |
| 7,124,389 | B2 | * | 10/2006 | Igarashi et al. ................ 716/13 |
| 2003/0229875 | A1 | * | 12/2003 | Smith et al. .................. 716/10 |
| 2004/0083446 | A1 | * | 4/2004  | Hasei ........................... 716/21 |

FOREIGN PATENT DOCUMENTS

| JP | H10335333  | 12/1998 |
| JP | 2000286263 | 10/2000 |
| JP | 2001007107 | 1/2001  |
| JP | 2001313294 | 11/2001 |

\* cited by examiner

*Primary Examiner*—Jack Chiang
*Assistant Examiner*—Binh C Tat
(74) *Attorney, Agent, or Firm*—Ira D. Blecker

(57) ABSTRACT

The invention provides a method for providing an integrated circuit (6) having a substantially uniform density between parts (10, 12, 14 and 16) of the IC that are non-orthogonally angled. In particular, the invention provides fill tiling patterns (32, 34) oriented substantially parallel to electrical structure regardless of their angle. A method of electrical analysis based on this provision is also provided as is a related program product.

12 Claims, 6 Drawing Sheets

IC TILING PATTERN METHOD, IC SO FORMED AND ANALYSIS METHOD

This is a continuation of PCT Application Number PCT/US02/41188 filed 20 Dec. 2002.

TECHNICAL FIELD

The present invention relates generally to fill tiling patterns for an integrated circuit.

BACKGROUND ART

Current integrated circuit (IC) manufacturing techniques benefit from a uniform density of wiring or conductors within a layer. For example, uniform density is required to prevent different amounts of wear across a plane during chemical mechanical polishing. To provide uniform density, various techniques for filling of empty spaces have been developed.

One challenge in providing uniform density of wiring within a plane is addressing the effect of fill tiling patterns on the electrical properties, i.e., fill tiles acting as fringe capacitance, on an adjacent wire. In particular, fill tiles add complexity to the electrical analysis of the circuit because each shape represents a floating conductor coupled by capacitors to the wire. As a result, the fill tiles change the overall capacitance between the connected wires of the circuit, and modify the electrical analysis result. Conventionally, fill tile patterning is addressed by predicting the electrical impact of the fill tiles relative to all electrically significant shapes. By mathematically removing accounting for the impact of the fill tiles, new capacitances between the connected circuits can be established and then fitted to modified expressions. One conventional technique for predicting the impact of fill tiles is to assume a uniform fill tile environment around shapes based on the predicted behavior of the fill tile pattern creation program. This technique is used because it takes into account the fill tile pattern without increasing the amount of computational resources required to analyze the layout compared to actually explicitly adding the fill tiles to the layout.

This uniform fill tile pattern assumption, historically, yields acceptable results because of the orthogonal nature of the wiring and fill tiles. That is, most wiring has an orthogonal layout (i.e., wires meet at right angles) and the fill tiles are oriented parallel thereto. Advancements in processing technology, however, are now making mixed non-orthogonal and orthogonal wiring patterns possible. Unfortunately, the provision of mixed orthogonal and non-orthogonal wiring with orthogonal fill tile patterns makes the fill tile environment non-uniform. Accordingly, consistent assumptions about the impact on electrical properties of the fill tile patterns are no longer possible. To illustrate, FIG. 1 shows an IC including orthogonal and non-orthogonal wiring and an orthogonal fill tiling pattern throughout. In this situation, one can assume for analysis a uniform environment across much of the IC because of the orthogonal nature of the wiring and fill tiles. However, because the distance of the tiling pattern from the non-orthogonal (diagonal) wire varies along the wire's length, a number of additional parameters for each non-orthogonal wire segment must be known in order to make valid assumptions. For example, the precise length, the corresponding periodicity and angle of the fill, and the impact on the electrical properties must be ascertained for each segment of non-orthogonal wire. Consideration of all of these parameters makes analysis of the impact of the orthogonal fill tiling on the adjacent non-orthogonal wiring impracticable.

In view of the foregoing, there is a need in the art for a method for providing a substantially uniform density for an integrated circuit having mixed orthogonal and non-orthogonal electrical structure, an IC so formed and a method of electrical analysis incorporating the same.

DISCLOSURE OF THE INVENTION

The invention relates to fill tiling of wiring patterns. The invention provides a method for providing, and an integrated circuit having, a substantially uniform conductor density across an IC layer by providing a substantially uniform tile density between parts of the IC that are arbitrarily or non-orthogonally angled. In particular, the invention provides tiling patterns oriented substantially parallel to electrical structure regardless of the structure's angle. A method of electrical analysis based on this provision is also provided as is a related program product.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

BEST MODE(S) FOR CARRYING OUT THE INVENTION

Figure 1:
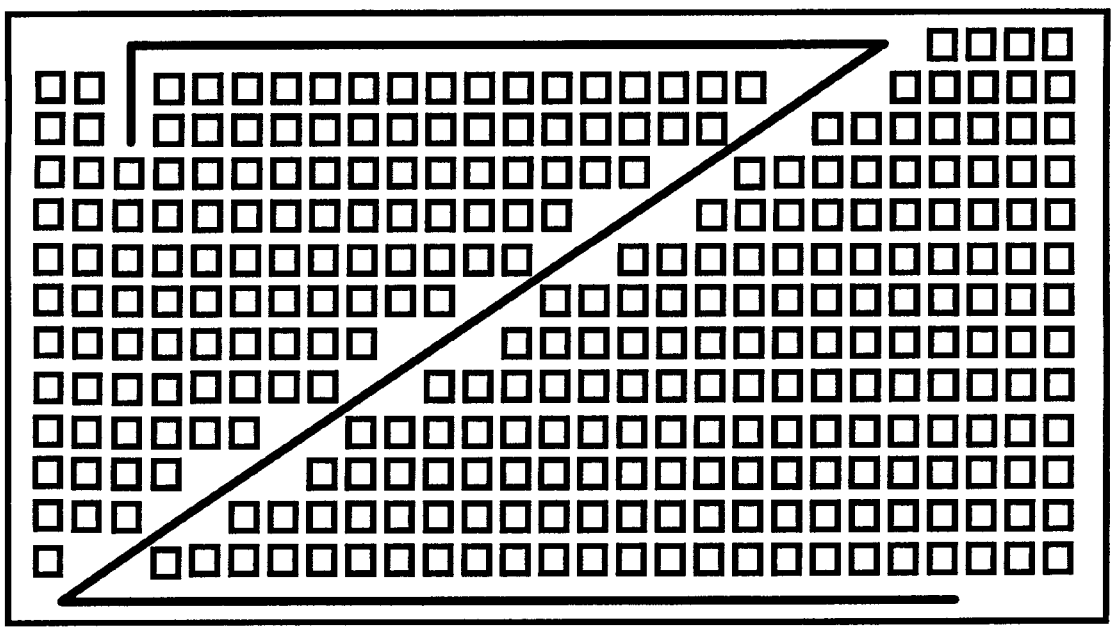
FIG. 1 shows a layer of a prior art integrated circuit having orthogonal fill tiling patterns positioned between mixed orthogonal and non-orthogonal wire segments.
Figure 2:
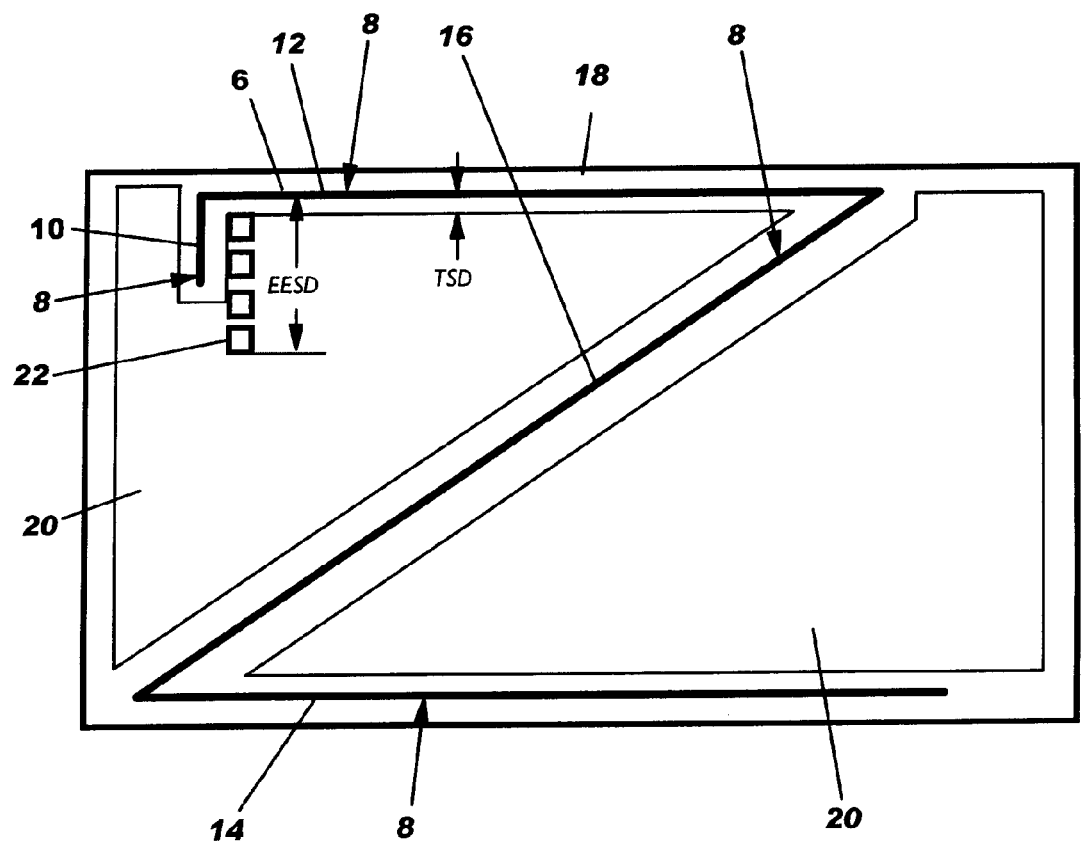
FIG. 2 shows a layer an integrated circuit including open regions for tiling.

With reference to the accompanying drawings, FIG. 2 shows a layer of an integrated circuit (IC) 6 including, among other things, a number of electrically impressionable parts 8. By "impressionable" is meant that the parts are susceptible to environmental influences that can alter their electrical properties. Hereinafter, electrically impressionable parts 8 will be described as wire segments 10, 12, 14, 16. It should be recognized, however, that a part 8 may be any structure of IC 6 that is electrically impressionable such as a resistor, well, power bus segment, shielding structure, ground plane, wave guide, etc. In one embodiment, wire segments 10, 12, 14 may be considered orthogonal because of their relation to each other and/or other structure of IC 6 (e.g., a "top" surface 18), and segment 16 may be considered non-orthogonal because of its relation to segments 10, 12, 14 or other structure of IC 6. It should be recognized that while a particular structural (i.e., wiring) pattern has been illustrated, the invention is applicable to practically any structural pattern (electrical part layout) where segments are non-orthogonally (or arbitrarily) angled relative to each other or other IC structure.

The invention provides a substantially uniform conductor density across an IC layer by providing a substantially uniform tile density between parts 8. The tile density is made uniform with fill tiling shapes that are rotated to substantially match the orientation of parts. As a result, the invention provides a substantially uniform conductor density across an IC layer. As used herein a "fill tile" or just "tile" shall refer to a conductive shape that is added to an area of an IC that does not include other structure, such as wiring, to provide a substantially uniform tile density for the area. As known in the art, fill tiles can be repeated to form patterns to provide a substantially uniform tile density over wider areas. As used herein "substantially uniform density" shall mean uniform or nearly uniform (tile or conductor) density such that the density in issue is within some user-defined preset range, which may vary for example according to technology.

Figure 3:
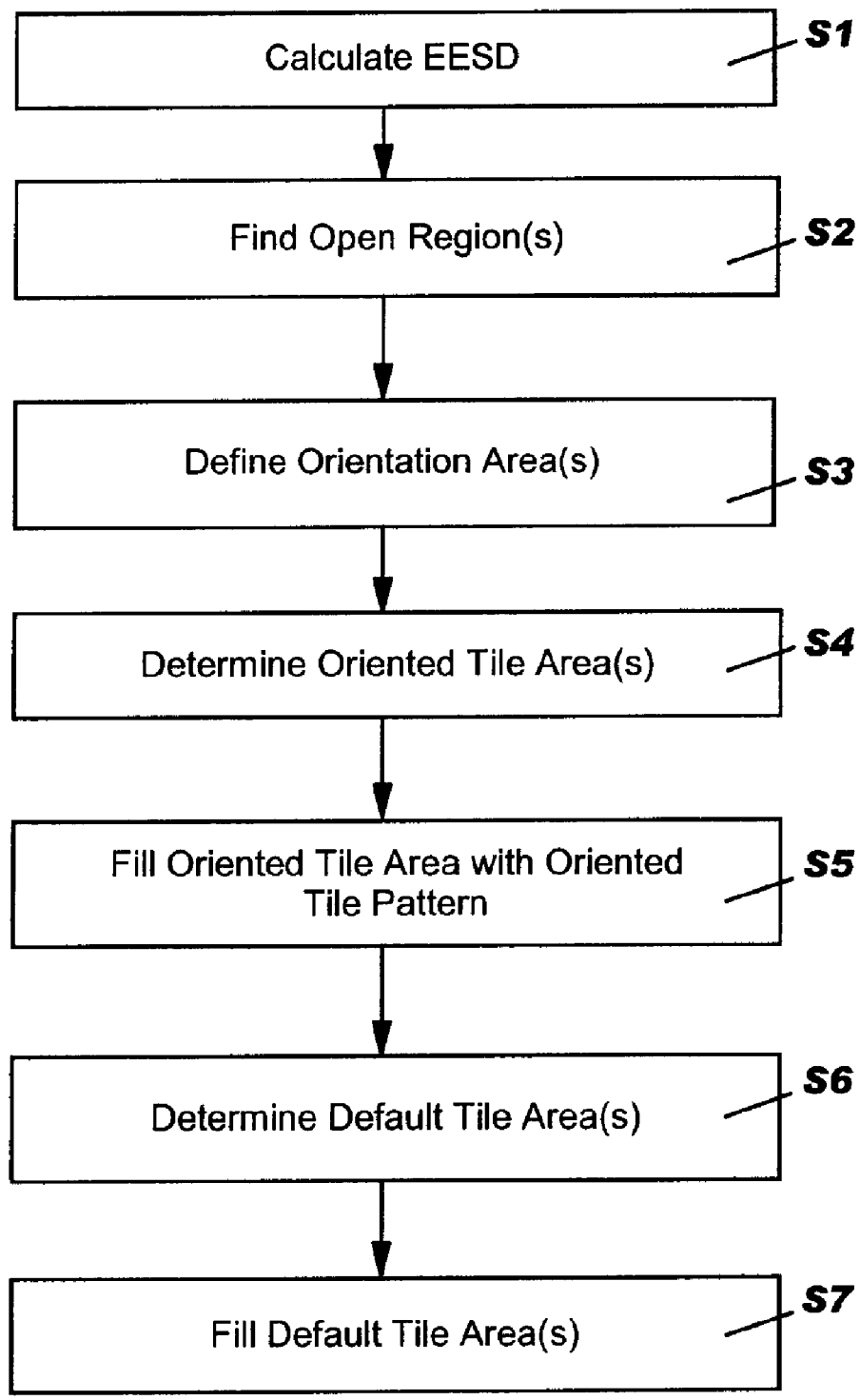
FIG. 3 shows a flow diagram of a method for providing a substantially uniform density for the IC of FIG. 2.

FIG. 3 shows a flow diagram of a method for providing substantially uniform density for an IC 6 (FIG. 2) having a wire segment(s) 10, 12, 14 having a first orientation and a wire segment(s) 16 having a second orientation that is non-orthogonally angled relative to at least the other structure(s) 10, 12, 14. The first orientation is generally referred to as being orthogonal because of the structures' orthogonal relationship to one another and other structure of IC 6. It should be recognized that the method is a method of analysis, not of actual construction.

Steps S1 to S4, in combination, represent a step of determining an oriented tile area (to be defined below) in which tiling oriented parallel to the first electrical structure (wire segment(s) 10, 12, 14 (FIG. 2)) causes non-uniform effects on electrical properties of the second electrical structure (wire segment 16).

In a first step, step S1, an effective electrical shielding distance (EESD) is calculated. The EESD is a distance outside of which the presence of a tile 22 (FIG. 2) does not significantly impact the electrical properties of an adjacent wire segment 10, 12, 14, 16. This step, in one embodiment, is provided by iteratively analyzing a small subset of wiring geometry (e.g., a particular technology) using conventional electrical circuit analysis tools such as a field solver available from, for example, SYNOPSYS, Inc. In each analysis cycle, a tile(s) 22 (FIG. 2) is added in a line extending away from a wire segment and oriented in the direction of the wire segment, and an analysis is completed to determine its impact (e.g., an amount of fringe capacitance generated by the tile) on the electrical properties of the wire segment. Each new tile 22 added is placed at the next appropriate distance from an adjacent tile and oriented in the direction of the respective wire segment. At some point, an additional tile 22, as determined by the electrical analysis, does not significantly impact the electrical properties of the wire segment. The distance at which the outermost edge of the last tile is placed from the wire is designated the EESD. The actual impact threshold necessary to trigger the EESD designation may be user defined and may vary according to, for example, technology, process, design rules, interlevel spacing, line width, etc.

For later reference, each wire segment 10, 12, 14, 16 also includes a "tile setback distance" (TSD) (FIG. 2) in which no tiles are to be provided because of manufacturing limitations such as lithography.

Next, in step S2, at least one open region 20 (FIG. 2) of IC 6 requiring tiles 22 is determined using conventional procedures. In one embodiment, regions 20 can be determined by simple rectilinear geometry techniques.

Figure 4:
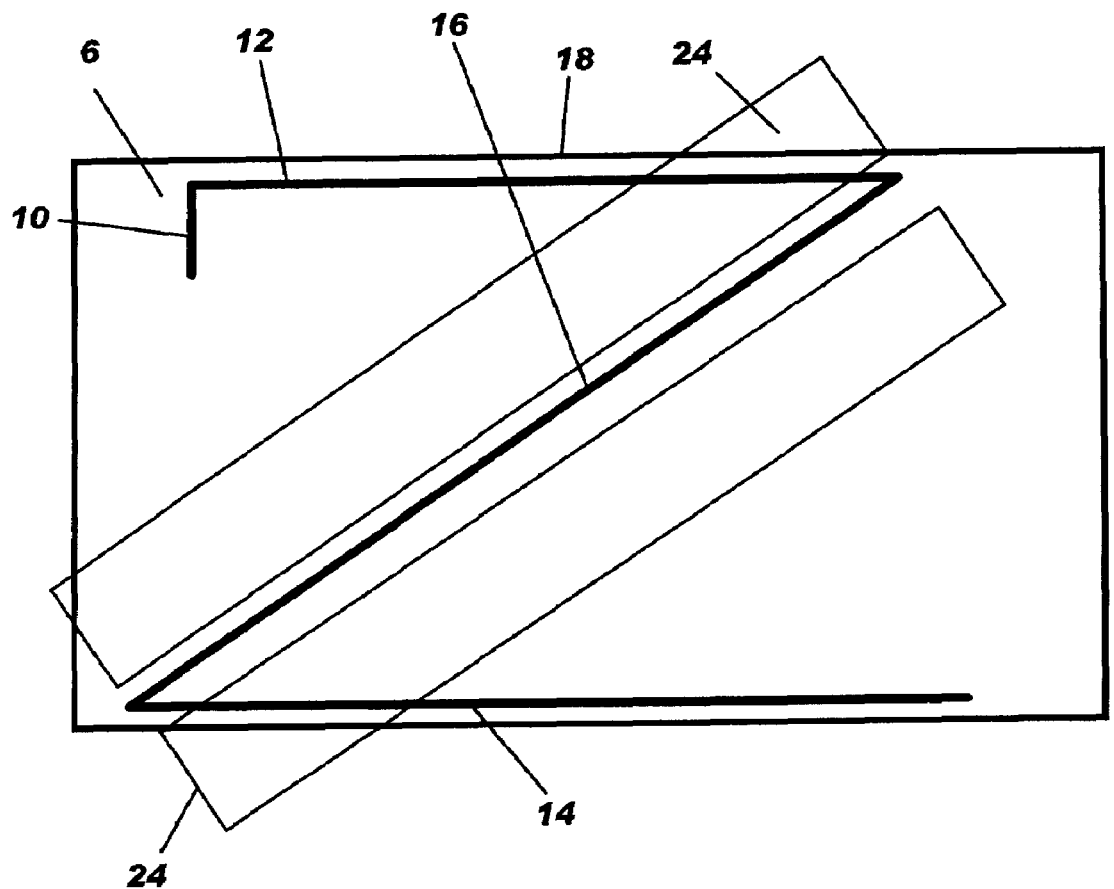
FIG. 4 shows the layer of FIG. 3 including orientation areas for comparison to the open regions.

In step S3, at least one orientation area 24 (FIG. 4), adjacent the second electrical structure 16, is defined between the EESD and the TSD of the second electrical structure. Each orientation area 24 represents an area requiring tiles that are oriented differently than a default tile pattern. A "default tile pattern" is a tile pattern that is most prevalent on a layer. In the embodiment shown, the default tile pattern is a pattern oriented to be parallel to the electrical structures 10, 12, 14, i.e., the orthogonal structures. To identify which wire segments require an orientation area, this step may include a precursor sorting of wire segments 10, 12, 14, 16 according to orientation. Those wire segment(s) 16 that are angled relative to other wire segments 10, 12, 14 will experience non-uniform effects on electrical properties because the default tiling pattern is not parallel thereto. The basis for sorting may be user defined. In the embodiment shown, wire segments may be sorted according to whether they are generally orthogonal or non-orthogonal relative to other wire segments of IC 6. In this case, wire segments 10, 12, 14, as mentioned above, would be denoted orthogonal and wire segment 16 would be denoted non-orthogonal. Further, in this embodiment, a default tile pattern would be one that is oriented parallel to wire segments 10, 12, 14. It should be recognized that any mechanism of sorting orientation that is advantageous may be used. For example, orientation may be denoted by angle relative to a "top" surface 18 of IC 6 or other structure. Further, it should be recognized that any number of orientation labels may be used. For instance, wire segments 10, 12, 14 may be further sorted as "vertical" and "horizontal." Once any sorting is complete, orientation areas 24 are determined. In one embodiment, this determination is made by subtracting the TSD from the EESD for each wire segment 16 that is angled relative to other wire segments 10, 12, 14 or other structure of IC 6.

Figure 5:
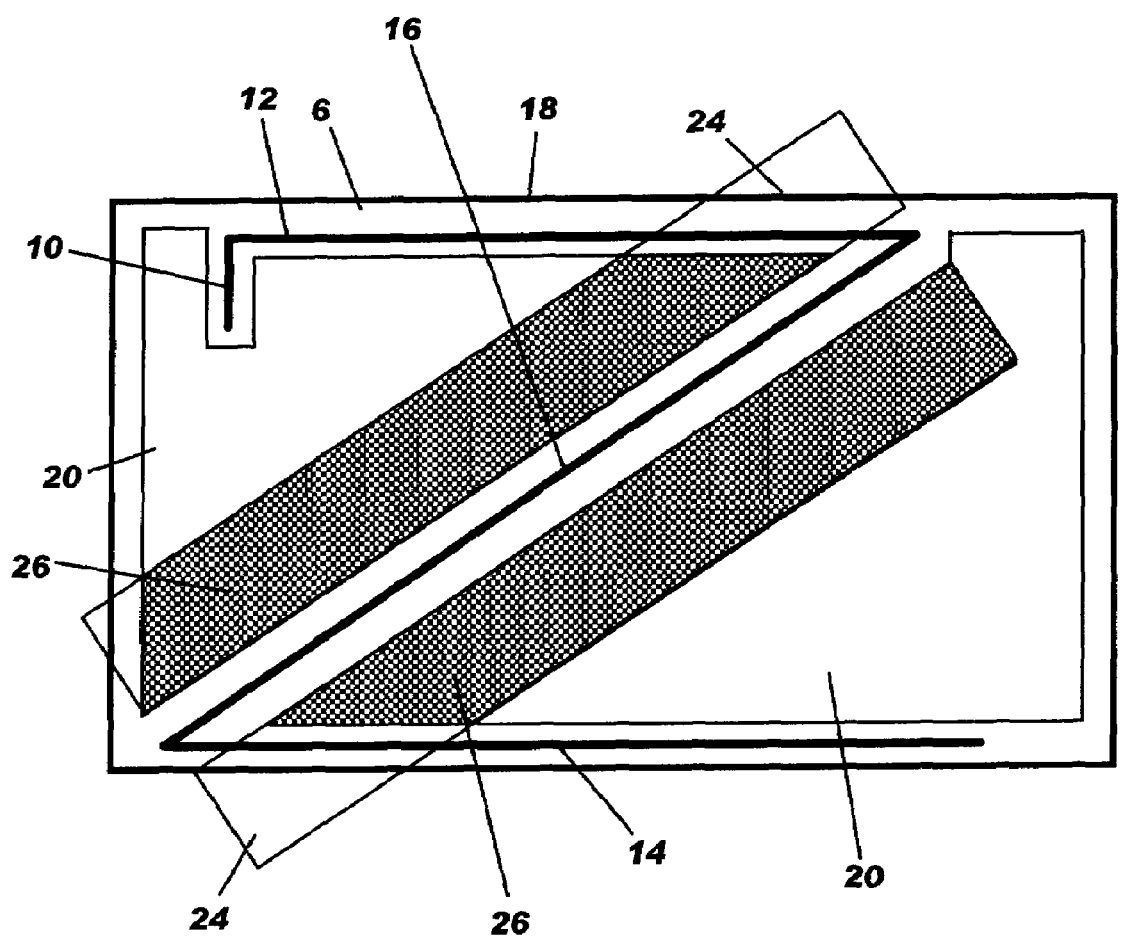
FIG. 5 shows the layer of FIG. 3 including oriented tile areas.

Next in step S4, as shown in FIG. 5, any orientation areas 24 are overlaid with any open regions 20, as determined in step S2, to determine oriented tile areas 26 (shaded). "Oriented tile areas" 26 are those areas to be tiled with oriented tiles, i.e., tiles set at an angle other than that of the default tile pattern. The oriented tile areas 26 are presented where orientation areas 24 overlap with open regions 20.

Figure 6:
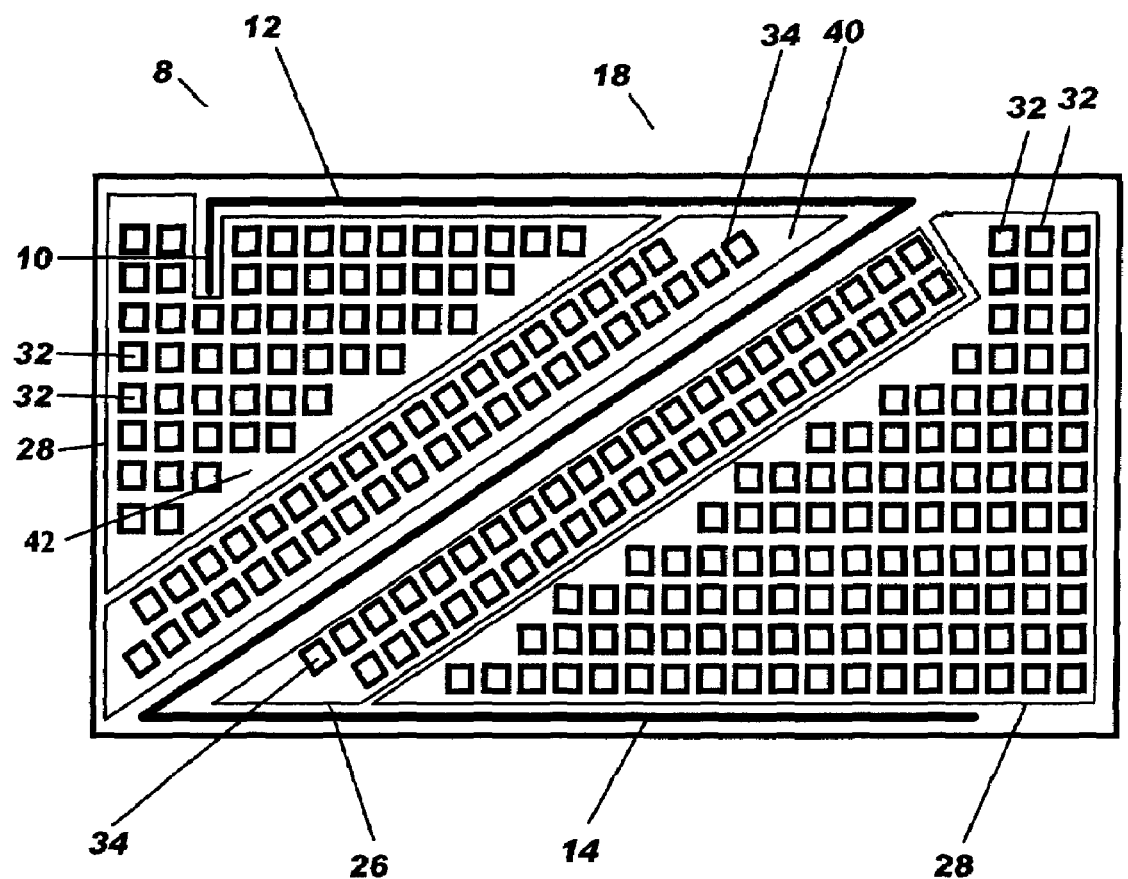
FIG. 6 shows the layer of FIG. 3 including fill tiling patterns oriented to substantially match the orientation of adjacent wire segments.

In step S5, the appropriately oriented tiles 34, i.e., an oriented tile pattern, are applied to oriented tile areas 26 as shown in FIG. 6. The size and orientation of tiling 34 is constant within oriented tile area 26.

In step S6, default tile areas 28 (FIG. 6) that receive the default tile pattern are determined. Default tile areas 28 are areas not included as oriented tile areas 26 but are within open regions 20. In one embodiment, the determination of default tile areas 28 is made by subtracting orientation areas 26 from open regions 20.

Finally, in step S7, default tile areas 28 are filled with the default tiles 32, i.e., a default tile pattern. The size and orientation of tiling is constant within default tile area 28.

With continuing reference to FIG. 6, transitions between different tile patterns may be handled in a number of ways. First, in acute angles 40 between wire segments, at least one tile of one of the tiling patterns that is within the acute angle can be omitted. For example, tiles 32, 34 may be omitted for a sufficient area 40 to minimize (i.e., remove or significantly reduce) their effect on electrical properties. This may occur, for example, by omitting tiles 32, 34 that are the closest to their respective wire segment since they generate the greatest fringe capacitance. If two or more shapes are equidistant from their respective wire segments, one tile may be selected arbitrarily and others omitted. An amount of residual error caused by this accommodation can be taken into consideration during the electrical analysis. Second, away from wire segments 10, 12, 14, 16, seams 42 can be arbitrarily introduced between uniformly tiled patterns. The result is tile patterns near corners that are handled as a special case during extraction, or seams that are away from wire segments 10, 12, 14, 16.

As the effects of the above accommodations are outside the EESD, only vertical capacitances are apparently impacted, i.e., those between IC layers, which have an open metal layer therebetween. This is similar to a capacitance from a first to a third layer being impacted by fill on a second layer. In practice, however, the specific configuration of fill tiles has very little effect on the vertical capacitance. As the size of the tiles are not changing, only the variation in the density of the tiles is of impact. The effective size of the tiles is significantly enlarged due to the fringe capacitance into the sides of the tiles. The variation of the effective density is very small, as a removal of a single tile creates only a very small change in the effective density of tiles.

It should be recognized that the teachings of the invention as described above can be repeated for each layer of IC 6. In addition, it should be recognized that the teachings of the invention are applicable to any orientation of structure.

As shown in FIG. 6, the resulting IC 6 includes at least one layer having a first electrical structure 10, 12 or 14 non-orthogonally angled relative to a second electrical structure 16 and a substantially uniform density across the layer. The substantially uniform density is provided by having a first tile pattern 32 oriented substantially parallel to the first electrical structure (i.e., wire segment 10, 12 or 14), and a second tile pattern 34 oriented substantially parallel to the second electrical structure 16. As used herein, "substantially parallel" means parallel or nearly parallel.

The invention also includes a method of electrical analysis (extraction) of an integrated circuit 6 having a layer including a first electrical structure 10, 12, 14 non-orthogonally angled relative to a second electrical structure 16 based on the provisions of the above method. In particular, the above-described method allows for a determination of the electrical impact, i.e., the impact on the electrical properties, of the tile pattern oriented substantially parallel to the first electrical structure 10, 12, 14 on that structure, and the tile pattern oriented substantially parallel to second electrical structure 16 on that structure. The electrical analysis conducted based on these electrical impact determinations results in a more precise analysis. A more precise analysis allows for evaluation of the more uniform density across a layer of an IC and the corresponding improved performance. The electrical analysis can also include the above methods of providing the substantially uniform density.

In the previous discussion, it will be understood that the method steps discussed may be performed by a processor, such as CPU of computer system, executing instructions of program product stored in memory. It is understood that the various devices, modules, mechanisms and systems described herein may be realized in hardware, software, or a combination of hardware and software, and may be compartmentalized other than as shown. They may be implemented by any type of computer system or other apparatus adapted for carrying out the methods described herein. A typical combination of hardware and software could be a general-purpose computer system with a computer program that, when loaded and executed, controls the computer system such that it carries out the methods described herein. Alternatively, a specific use computer, containing specialized hardware for carrying out one or more of the functional tasks of the invention could be utilized. The present invention can also be embedded in a computer program product, which comprises all the features enabling the implementation of the methods and functions described herein, and which—when loaded in a computer system—is able to carry out these methods and functions. Computer program, software program, program, program product, or software, in the present context mean any expression, in any language, code or notation, of a set of instructions intended to cause a system having an information processing capability to perform a particular function either directly or after the following: (a) conversion to another language, code or notation; and/or (b) reproduction in a different material form.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

INDUSTRIAL APPLICABILITY

The invention is useful for providing a substantially uniform density in a layer of an integrated circuit having electrical structure that is angled relative to other electrical structure.

What is claimed is:

1. An integrated circuit (6) (IC) including at least one layer having a first electrical structure (10, 12, 14) non-orthogonally angled relative to a second electrical structure (16), the IC comprising:
   a first tile pattern (32) in the at least one layer having a first tile orientation oriented substantially parallel to the first electrical structure; and
   a second tile pattern (34) in the at least one layer having a second tile orientation oriented substantially parallel to the second electrical structure, wherein the first tile orientation is different from the second tile orientation;
   wherein the first tile pattern (32) comprises a plurality of tiles having an edge oriented substantially parallel to the first electrical structure and the second tile pattern (34) comprises a plurality of tiles having an edge oriented substantially parallel to the second electrical structure and wherein the first electrical structure (10, 12, 14) is provided orthogonally relative to other structure (18) of the IC, and the second electrical structure (16) is provided non-orthogonally to other structure of the IC.

2. The IC of claim 1, wherein the first and second tiling pattern (32, 34) in combination with the first and second electrical structure (10, 12, 14, 16) provide a substantially uniform density across the at least one layer of the IC.

3. The IC of claim 2, wherein a size and orientation of each tiling pattern (32, 34) is constant within a respective tiled area.

4. The IC of claim 1, wherein the electrical structures (10, 12, 14, 16) are wire segments.

5. The IC of claim 1 wherein the first tile pattern (32) comprises a plurality of tiles each of which is a conductive shape that is added to an area of the IC that does not include wiring and the second tile pattern (34) comprises a plurality of tiles each of which is a conductive shape that is added to an area of the IC that does not include wiring.

6. A method of electrical analysis of an integrated circuit (6) (IC) having a layer including a first electrical structure (10, 12, 14) non-orthogonally angled relative to a second electrical structure (16), the method comprising the steps of:
   determining by a processor an electrical impact of a tile pattern (32) in the layer having a first tile orientation oriented substantially parallel to the first electrical structure on the first electrical structure;
   determining by a processor an electrical impact of a tile pattern (34) in the layer having a second tile orientation oriented substantially parallel to the second electrical structure on the second electrical structure, wherein the first tile orientation is different from the second tile orientation; and conducting by a processor an electrical analysis based on the determined electrical impacts; wherein the first electrical structure (10, 12, 14) is provided orthogonally relative to other structure (18) of the IC, and the second electrical structure (16) is provided non-orthogonally to other structure of the IC and wherein the first tile pattern (32) comprises a plurality of tiles having an edge oriented substantially parallel to the first electrical structure and the second tile pattern (34) comprises a plurality of tiles having an edge oriented substantially parallel to the second electrical structure.

7. The method of claim 6, wherein the steps of determining include:

determining an oriented tile area (26) in the layer in which tiling oriented substantially parallel to the first electrical structure (10, 12, 14) causes non-uniform effects on electrical properties of the second electrical structure; and filling the oriented tile area with a tiling pattern (34) in the layer oriented substantially parallel to the second electrical structure (16).

8. The method of claim 6 wherein the first tile pattern (32) comprises a plurality of tiles each of which is a conductive shape that is added to an area of the IC that does not include wiring and the second tile pattern (34) comprises a plurality of tiles each of which is a conductive shape that is added to an area of the IC that does not include wiring.

9. An integrated circuit (6) (IC) including at least one layer having a first electrical structure (10, 12, 14) non-orthogonally angled relative to a second electrical structure (16), the IC comprising:

a substantially uniform density across the layer created by having a first tile pattern (32) in the at least one layer having a first tile orientation oriented substantially parallel to the first electrical structure (10, 12, 14); and a second tile pattern (34) in the at least one layer having a second tile orientation oriented substantially parallel to the second electrical structure (16), wherein the first tile orientation is different from the second tile orientation;

wherein the first tile pattern (32) comprises a plurality of tiles having an edge oriented substantially parallel to the first electrical structure and wherein the first electrical structure (10, 12, 14) is provided orthogonally relative to other structure (18) of the IC, and the second electrical structure (16) is provided non-orthogonally to other structure of the IC and the second tile pattern (34) comprises a plurality of tiles having an edge oriented substantially parallel to the second electrical structure.

10. The IC of claim 9, wherein a size and orientation of each tiling pattern (32, 34) is constant within a respective tiled area.

11. The IC of claim 9, wherein the electrical structures are wire segments.

12. The IC of claim 9 wherein the first tile pattern (32) comprises a plurality of tiles each of which is a conductive shape that is added to an area of the IC that does not include wiring and the second tile pattern (34) comprises a plurality of tiles each of which is a conductive shape that is added to an area of the IC that does not include wiring.

* * * * *

UNITED STATES PATENT AND TRADEMARK OFFICE
CERTIFICATE OF CORRECTION

PATENT NO. : 7,669,159 B2 Page 1 of 1
APPLICATION NO. : 11/160339
DATED : February 23, 2010
INVENTOR(S) : Allen et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 771 days.

Signed and Sealed this

Seventh Day of December, 2010

David J. Kappos
*Director of the United States Patent and Trademark Office*